(12) United States Patent
Lee

(10) Patent No.: US 6,251,750 B1
(45) Date of Patent: Jun. 26, 2001

(54) METHOD FOR MANUFACTURING SHALLOW TRENCH ISOLATION

(75) Inventor: Claymens Lee, Kaohsiung Hsien (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/396,140

(22) Filed: Sep. 15, 1999

(51) Int. Cl.$^7$ ..................................................... H01L 21/76
(52) U.S. Cl. ........................................... 438/432; 438/221
(58) Field of Search ..................................... 438/221, 296, 438/424, 432, 431, 426, 425, 400, 439, 445, 917

(56) References Cited

U.S. PATENT DOCUMENTS

| | | | |
|---|---|---|---|
| 5,918,131 | * 6/1999 | Hsu et al. | 438/296 |
| 5,950,090 | * 9/1999 | Chen et al. | 438/296 |
| 6,093,600 | * 7/2000 | Chen et al. | 438/243 |
| 6,107,159 | * 8/2000 | Chuang | 438/432 |
| 6,121,110 | * 9/2000 | Hong et al. | 438/400 |

* cited by examiner

Primary Examiner—David Nelms
Assistant Examiner—David Nhu

(57) ABSTRACT

A method of manufacturing a shallow trench isolation in a substrate. The substrate has a pad oxide layer and a mask layer formed thereon in sequence and a trench penetrating through the mask layer and the pad oxide layer and into the substrate. A thermal oxidation process is performed to form a liner oxide layer on a portion of the substrate exposed by the trench. A spacer is formed on the sidewall of the mask layer, the pad oxide layer and the trench. An oxidation process is performed to oxidize a portion of the substrate under a portion of the liner oxide layer located on the bottom of the trench. An insulating layer is formed over the substrate and filling the trench. A planarization process is performed to remove a portion of the insulating layer until the mask layer is exposed. The mask layer and the pad oxide layer are removed.

15 Claims, 3 Drawing Sheets

METHOD FOR MANUFACTURING SHALLOW TRENCH ISOLATION

BACKGROUND OF THE INVENTION

1. Field of Invention

The present invention relates to a method for manufacturing a semiconductor device. More particularly, the present invention relates to a method for manufacturing a shallow trench isolation.

2. Description of Related Art

An isolation region is formed in an integrated circuit for the purpose of separating neighboring device regions of a substrate and preventing the carriers from penetrating through the substrate to neighboring devices. Conventionally, the local oxidation of silicon (LOCOS) technique is widely utilized in semiconductor industry to provide isolation regions among the various devices in the substrate. Since the LOCOS technique has been used for quite a period of time, it is one of the most reliable and low-cost methods for fabricating device isolation region. However, the bird's beak structure of the field oxide formed by LOCOS technique limits the size of the integrated circuit. Hence, a shallow trench isolation (STI) technique has been developed and is currently applied in the integrated circuit process, especially in the sub-half micron integrated circuit process.

In the current process for manufacturing a STI, a silicon nitride layer is used as a mask layer and a trench is formed in the substrate by anisotropically etching. And then, an oxide material is deposited in the trench and fills the trench to form a STI. Next, a chemical-mechanical polishing step is used to planarize the oxide layer and to form an STI region. Therefore, the problem induced by the bird's beak can be overcome. However, the typical trench is a tapered trench; that is, the bottom of the trench is smaller than the opening of the trench. As line width becomes smaller and integration becomes higher, the width of the STI used to isolate the neighboring active regions is decreased. Hence, a bridging effect occurs between the neighboring active regions isolated by the STI. The bridging effect is especially obvious in processes below 0.18 microns.

SUMMARY OF THE INVENTION

The invention provides a method of manufacturing a shallow trench isolation in a substrate. The substrate has a pad oxide layer and a mask layer formed thereon in sequence and a trench penetrating through the mask layer and the pad oxide layer and into the substrate. A thermal oxidation process is performed to form a liner oxide layer on a portion of the substrate exposed by the trench. A spacer is formed on the sidewall of the mask layer, the pad oxide layer and the trench. An oxidation process is performed to oxidize a portion of the substrate under a portion of the liner oxide layer located on the bottom of the trench. An insulating layer is formed over the substrate and filling the trench. A planarization process is performed to remove a portion of the insulating layer until the mask layer is exposed. The mask layer and the pad oxide layer are removed.

As embodied and broadly described herein, during the oxidation process, the oxygen penetrates through the portion of the liner oxide layer exposed by the spacer on the bottom of the trench to oxidize the portion of the substrate under the exposed portion of the liner oxide layer. Therefore, a nubbly rough insulating layer is formed at the bottom of the trench. Because the undesirable current between the neighboring devices flows along the margin of the trench and the oxide layer in the substrate, the current channel distance between the neighboring devices is larger than the conventional current channel. Hence, the bridging effect does not occur between the neighboring devices.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

FIGS. 1A through 1H are schematic, cross-sectional views of the process for manufacturing a shallow trench isolation in a preferred embodiment according to the invention.

Figure 1A:
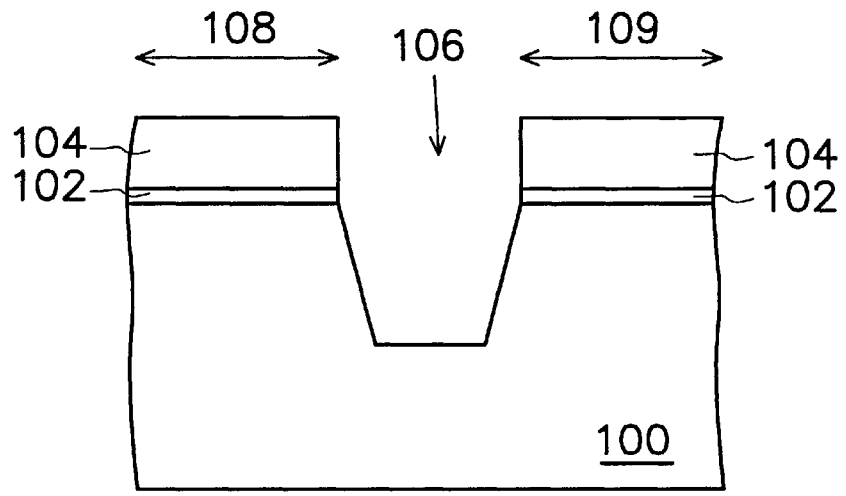
FIGS. 1A through 1H are schematic, cross-sectional views of the process for manufacturing a shallow trench isolation in a preferred embodiment according to the invention.

As shown in FIG. 1A, a substrate 100 having a pad oxide layer 102 formed thereon is provided. The pad oxide layer 102 will be removed in the subsequent process. Preferably, the method of forming the pad oxide layer 102 is chemical vapor deposition (CVD), for example. A mask layer 104 is formed on the pad oxide layer 102. The mask layer 104 can be formed from silicon nitride by CVD, for example. A portion of the mask layer 104, pad oxide layer 102 and substrate 100 is removed to form a trench 106 is the substrate 100 and to define active regions 108 and 109.

Figure 1B:
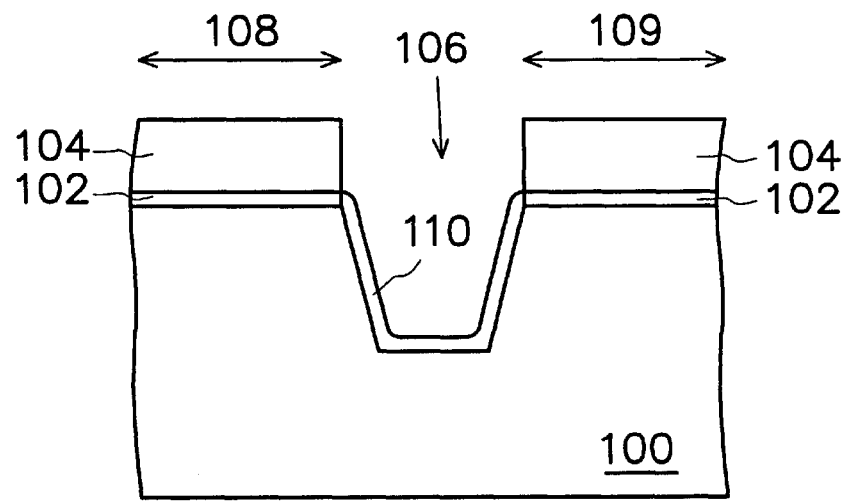

As shown in FIG. 1B, a liner oxide layer 110 is formed on the surface of the substrate 100 exposed by the trench 106. The method of forming the liner oxide layer 110 can be thermal oxidation.

Figure 1C:
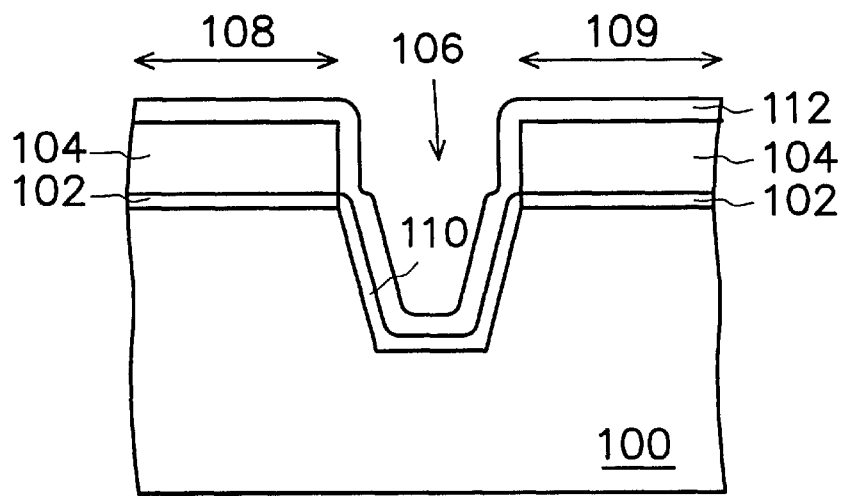

As shown in FIG. 1C, an insulating layer 112 is conformally formed over the substrate 100. The insulating layer 112 can be formed from silicon nitride by CVD, for example.

Figure 1D:
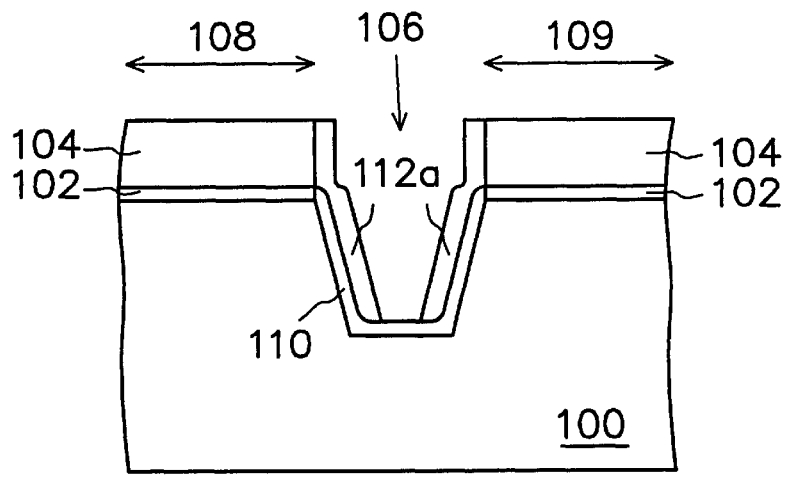

As shown in FIG. 1D, a portion of the insulating layer 112 is removed to expose the upper face of the mask layer 104 and the portion of the liner oxide layer 110 on the bottom of the trench 106. The remaining insulating layer 112 on the sidewall of the trench 106 and the mask layer 104 is denoted as a spacer 112a. The method of removing the portion of the insulating layer 112 can be etching back, for example.

Figure 1E:
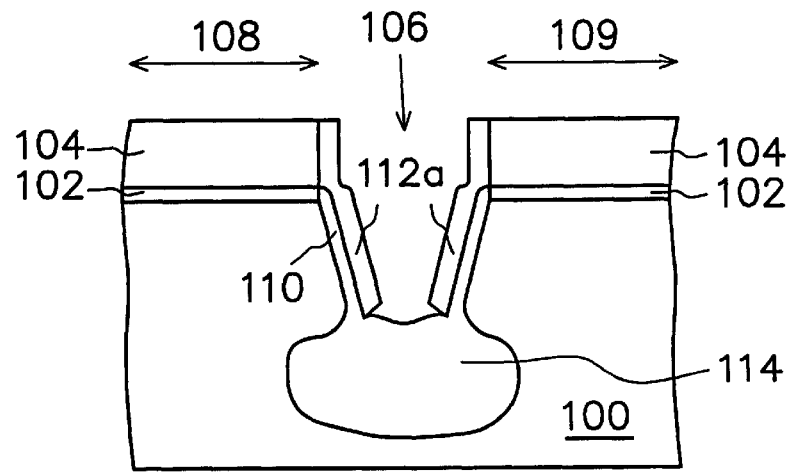

As shown in FIG. 1E, an oxidation process is performed while using the spacer 112a as a mask and the oxygen penetrates through the exposed portion of the liner oxide layer 110 to oxidize a portion of the substrate 100 under the exposed portion of the liner oxide layer 110. Therefore, the exposed portion of the liner oxide layer 110 expands to form a nubbly rough insulating layer 114 at the bottom of the trench 106. The oxidation process can be a local oxidation process, for example. The insulating layer 114 is a bottom portion of the STI formed subsequently. Because of the isolation of the insulating layer 114, the undesirable connection channel between the devices respectively formed in the active regions 108 and 109 is increased. Therefore, the bridging effect between the active regions 108 and 109 will not occur.

Figure 1F:
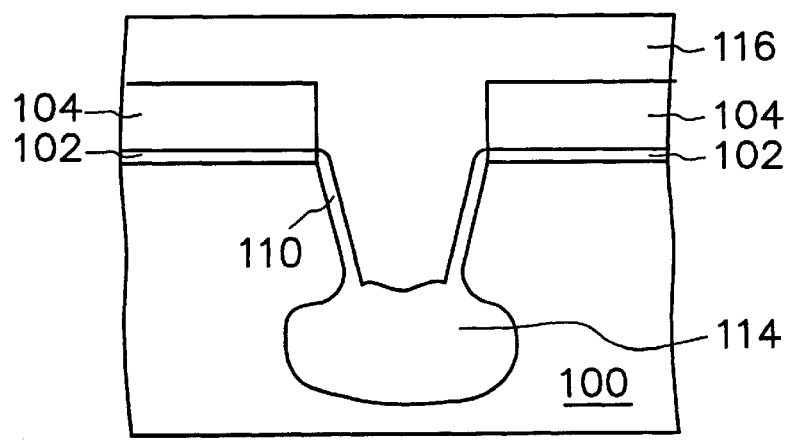

As shown in FIG. 1F, the spacer 112a is removed. An insulating layer 116 is formed on the mask layer 104, the liner oxide layer 110 and the insulating layer 114 and fills the trench 106. The method of forming the insulating layer 106 comprises the step of forming a silicon oxide layer over the substrate 100 to fill the trench 106 by atmospheric pressure chemical vapor deposition (APCVD), and then performing a densification process to form the insulating layer 116 with a relatively dense structure.

Figure 1G:
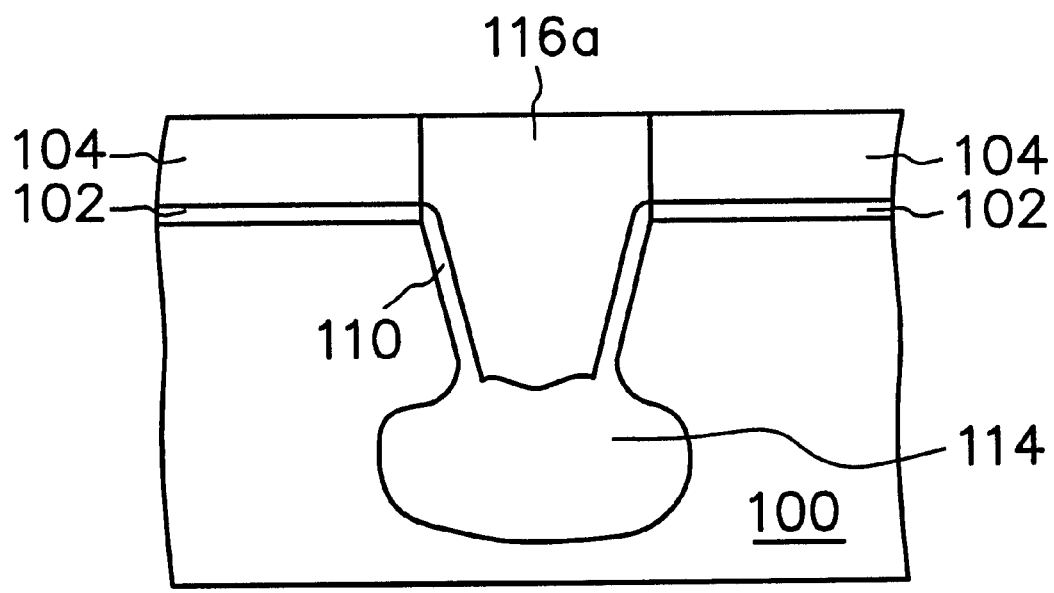

As shown in FIG. 1G, a planarization process is performed to remove a portion of the insulating layer 116 until the surface of the mask layer 104 is exposed. The remaining insulating layer 116 in the trench 106 is denoted as an insulating filler 116a. The planarization process can be chemical-mechanical polishing (CMP), for example.

Figure 1H:
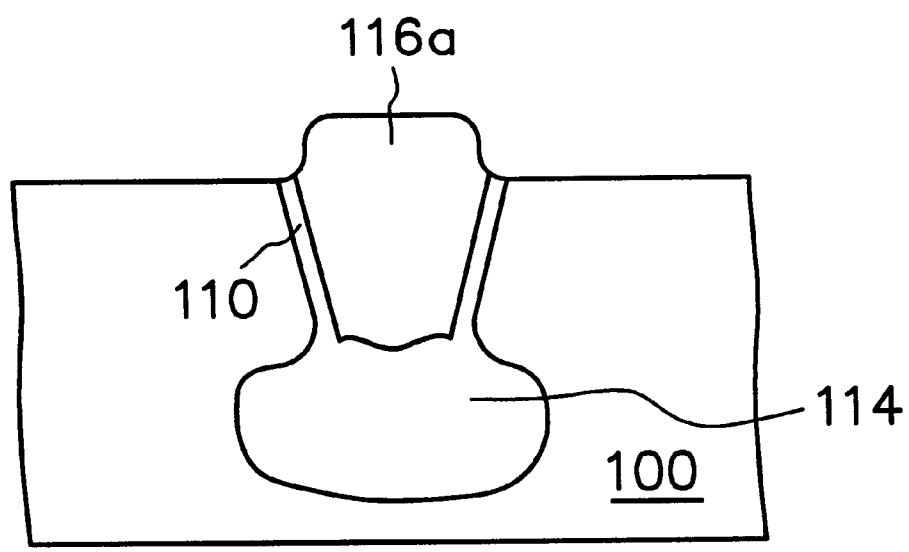

As shown in FIG. 1H, the mask layer 104 and the pad oxide layer 102 are removed. The method for removing the mask layer 104 and the pad oxide layer 102 can be wet etching, for example. Simultaneously, a portion of the upper part of the insulating filler 116a and a portion of the substrate 100 adjacent to the insulating filler 116a are removed. The remaining insulating filler 116a is denoted as an insulating filler 116b and the insulating filler 116b and the insulating layer 114 together form a STI 117. After that, the process for manufacturing the STI is finished.

In the preferred embodiment mentioned above, the undesirable current between the neighboring devices flows along the margin of the STI 117. In accordance with the invention, since the current channel distance between the neighboring devices is larger than the conventional current channel, the bridging effect does not occur between the neighboring devices.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a shallow trench isolation, comprising the steps of:
    providing a substrate;
    forming a pad oxide layer on the substrate;
    forming a mask layer on the pad oxide layer;
    patterning the mask layer, the pad oxide layer and the substrate to form a trench;
    performing a thermal oxidation process to form a liner oxide layer on a portion of the substrate exposed by the trench;
    forming a spacer on a sidewall of the mask layer, the pad oxide layer and the trench;
    performing an oxidation process to oxidize a portion of the substrate under a portion of the liner oxide layer located on a bottom of the trench;
    forming an insulating layer over the substrate and filling the trench;
    performing a planarization process to remove a portion of the insulating layer until the mask layer is exposed; and
    removing the mask layer and the pad oxide layer.

2. The method of claim 1, wherein the mask layer is made of silicon nitride.

3. The method of claim 1, wherein the method of forming the mask layer includes chemical vapor deposition.

4. The method of claim 1, wherein the step of forming the spacer comprises the step of:
    forming a conformal silicon nitride layer over the substrate; and
    performing an etching back process to remove a portion of the silicon nitride layer until a surface of the mask layer and a portion of the liner oxide layer on the bottom of the trench are exposed.

5. The method of claim 1, wherein the oxidation process includes a local oxidation process.

6. The method of claim 1, wherein the planarization process includes chemical-mechanical polishing.

7. The method of claim 1, wherein the step of removing the mask layer and the pad oxide layer includes wet etching.

8. A method of manufacturing a shallow trench isolation in a substrate, wherein the substrate has a pad oxide layer and a mask layer formed thereon in sequence and a trench penetrating through the mask layer and the pad oxide layer and into the substrate, the method comprising the steps of:
    performing a thermal oxidation process to form a liner oxide layer on a portion of the substrate exposed by the trench;
    forming a spacer on a sidewall of the mask layer, the pad oxide layer and the trench;
    performing an oxidation process to oxidize a portion of the substrate under a portion of the liner oxide layer located on a bottom of the trench;
    forming an insulating layer over the substrate and filling the trench;
    performing a planarization process to remove a portion of the insulating layer until the mask layer is exposed; and
    removing the mask layer and the pad oxide layer.

9. The method of claim 8, wherein the step of forming the spacer comprises the steps of:
    forming a conformal silicon nitride layer over the substrate; and
    performing an etching back process to remove a portion of the silicon nitride layer until a surface of the mask layer and a portion of the liner oxide layer on the bottom of the trench are exposed.

10. The method of claim 8, wherein the oxidation process includes a local oxidation process.

11. The method of claim 8, wherein the planarization process includes chemical-mechanical polishing.

12. The method of claim 8, wherein the step of removing the mask layer and the pad oxide layer includes wet etching.

13. A method of manufacturing a shallow trench isolation in a substrate, wherein the substrate has a trench penetrating into the substrate, the method comprising the steps of:

performing a thermal oxidation process to form a liner oxide layer on a portion of the substrate exposed by the trench;

forming a spacer on a sidewall of the trench;

performing an oxidation process to oxidize a portion of the substrate under a portion of the liner oxide layer located on a bottom of the trench;

forming an insulating layer over the substrate and filling the trench; and performing a planarization process to remove a portion of the insulating layer until the mask layer is exposed.

14. The method of claim 13, wherein the step of forming the spacer comprises the steps of:

forming a conformal silicon nitride layer over the substrate; and performing an etching back process to remove a portion of the silicon nitride layer until a surface of the mask layer and a portion of the liner oxide layer on the bottom of the trench are exposed.

15. The method of claim 13, wherein the oxidation process includes a local oxidation process.

* * * * *